(12) United States Patent
Kim

(10) Patent No.: US 7,626,263 B2
(45) Date of Patent: Dec. 1, 2009

(54) SEMICONDUCTOR DEVICE AND PACKAGE INCLUDING THE SAME

(75) Inventor: Dong-Han Kim, Gyeonggi-do (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 14 days.

(21) Appl. No.: 11/966,272

(22) Filed: Dec. 28, 2007

(65) Prior Publication Data

US 2008/0169560 A1    Jul. 17, 2008

(30) Foreign Application Priority Data

Jan. 11, 2007    (KR)    ...................... 10-2007-0003443

(51) Int. Cl.
*H01L 23/48* (2006.01)
*H01L 23/52* (2006.01)
*H01L 29/40* (2006.01)

(52) U.S. Cl. ............... 257/737; 257/738; 257/E23.021; 438/613; 438/614

(58) Field of Classification Search ................. 257/737, 257/738, E23.021, E23.069; 438/613–617
See application file for complete search history.

(56) References Cited

U.S. PATENT DOCUMENTS

| | | | | |
|---|---|---|---|---|
| 6,472,727 | B2 * | 10/2002 | Miyazaki et al. | 257/668 |
| 6,638,869 | B2 * | 10/2003 | Lai | 438/694 |
| 6,650,014 | B2 * | 11/2003 | Kariyazaki | 257/737 |
| 6,770,963 | B1 * | 8/2004 | Wu | 257/691 |
| 6,867,490 | B2 * | 3/2005 | Toyosawa | 257/692 |
| 2007/0080432 | A1 * | 4/2007 | Liu et al. | 257/666 |

FOREIGN PATENT DOCUMENTS

| | | |
|---|---|---|
| JP | 6-97218 | 4/1994 |
| JP | 2004-193223 | 7/2004 |
| JP | 2004-221320 | 8/2004 |
| JP | 2006-19699 | 1/2006 |
| KR | 10-2005-0100771 | 10/2005 |

OTHER PUBLICATIONS

English language abstract of Japanese Publication No. 6-97218.
English language abstract of Japanese Publication No. 2004-221320.
English language abstract of Korean Publication No. 10-2005-0100771.
English language abstract of Japanese Publication No. 2006-19699.

* cited by examiner

*Primary Examiner*—Phuc T Dang
(74) *Attorney, Agent, or Firm*—Marger Johnson & McCollom, P.C.

(57) ABSTRACT

Provided is a semiconductor device. The semiconductor device includes a first bump column on an active surface of the semiconductor device and including a plurality of first bumps spaced a first distance from an edge of the semiconductor device, a second bump column on the active surface and including a plurality of second bumps spaced a second distance that is greater than the first distance from the edge of the semiconductor device, and a third bump column on the active surface, and including a plurality of third bumps spaced a third distance that is greater than the second distance from the edge of the semiconductor device. The second bumps and the third bumps are sequentially alternated at least twice between the first bumps.

17 Claims, 6 Drawing Sheets

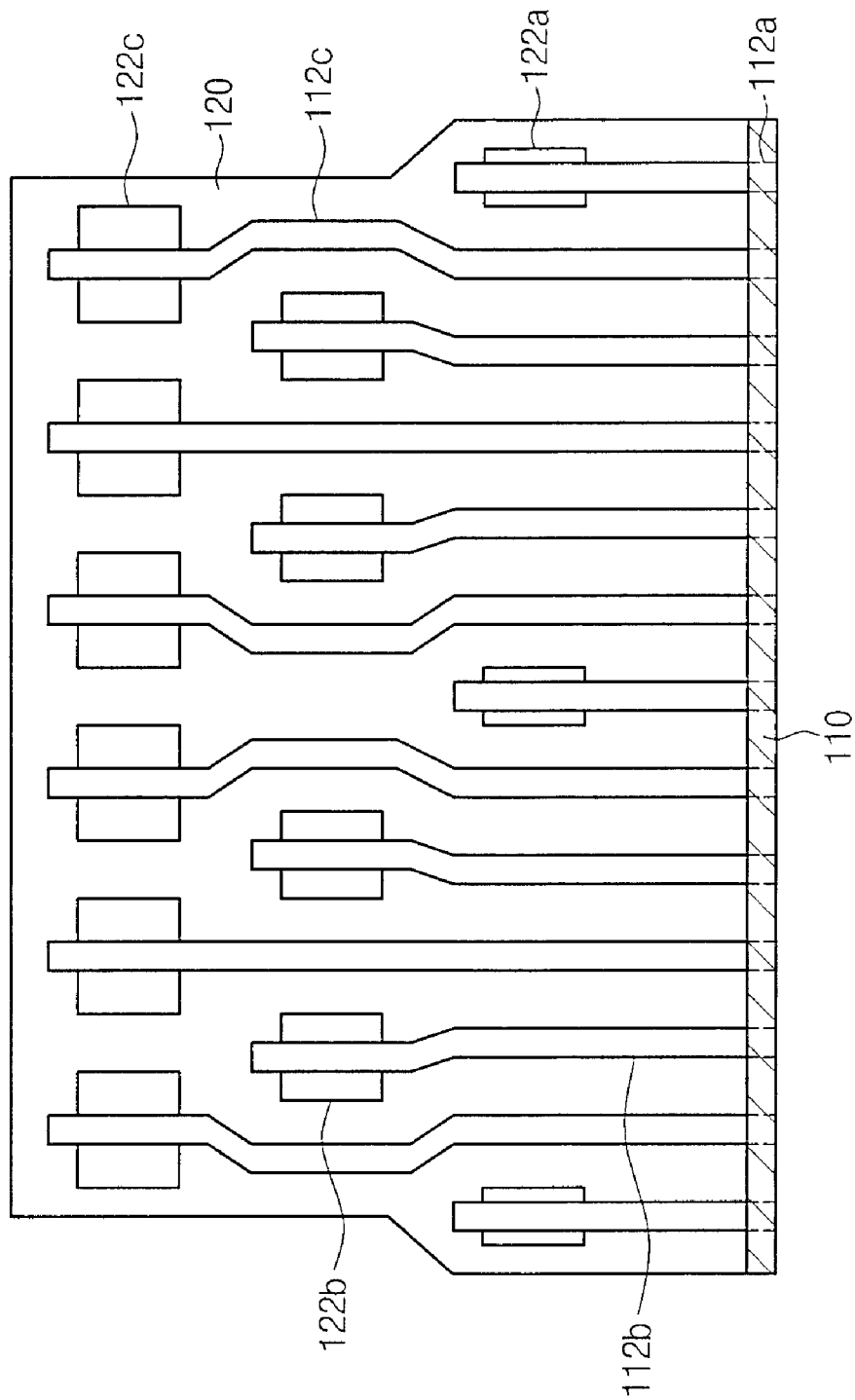

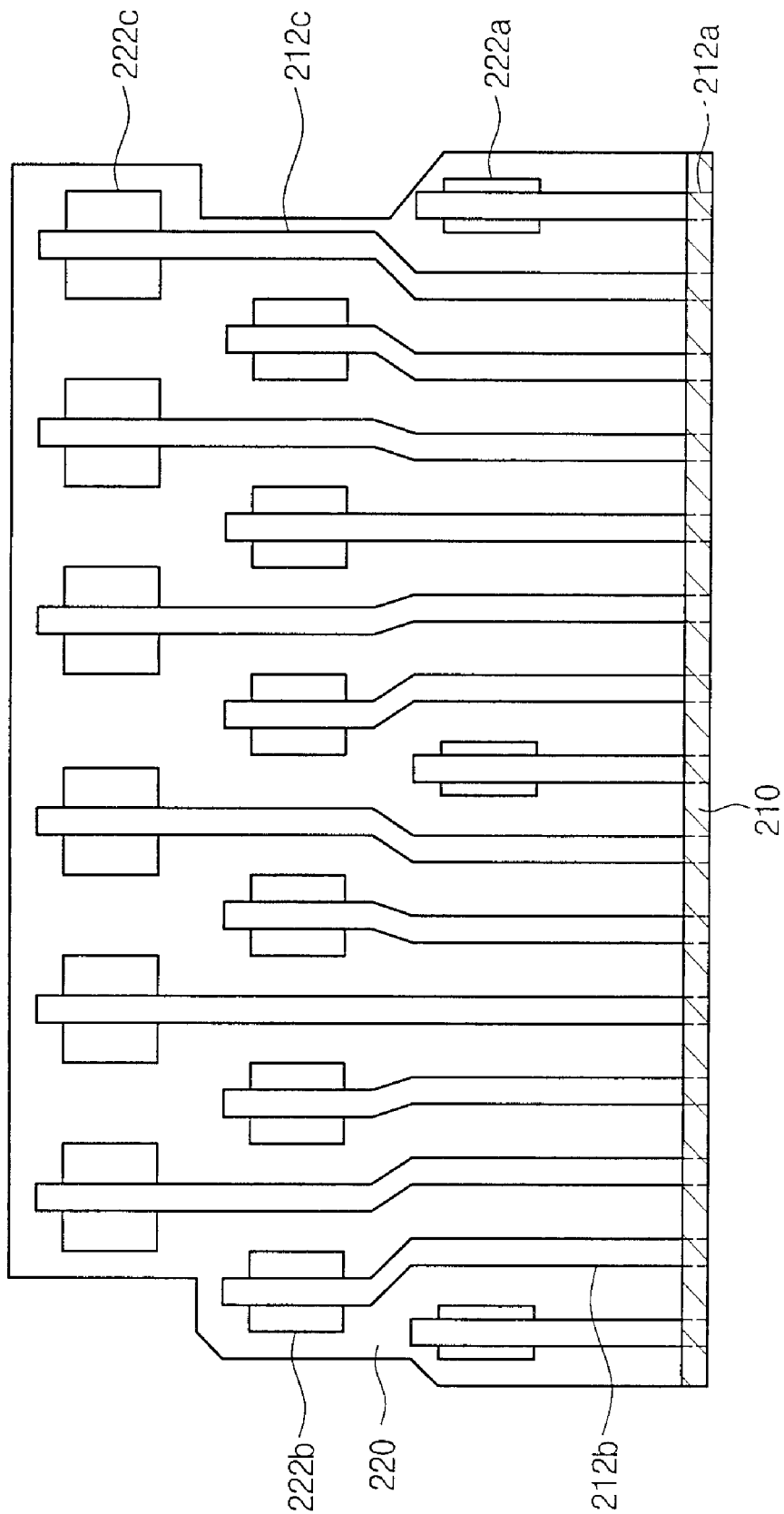

SEMICONDUCTOR DEVICE AND PACKAGE INCLUDING THE SAME

CROSS-REFERENCE TO RELATED APPLICATIONS

This U.S. non-provisional patent application claims priority under 35 U.S.C. § 119 to Korean Patent Application No. 10-2007-03443, filed on Jan. 11, 2007, the entire contents of which are hereby incorporated by reference.

BACKGROUND

1. Technical Field

The present invention relates to a semiconductor device and a semiconductor device package, and more particularly, to a bump arrangement for a semiconductor device and a semiconductor device package including the same.

2. Description of the Related Art

In order to meet demands for increasingly light-weight, miniaturized, faster, multifunctional, and higher-capacity semiconductor products, the size of a semiconductor device must be decreased while increasing the number of pads on the device. One approach to accomplish this is shortening the pitch between neighboring pads. Ultimately, there is a limit to the number of pads that may be formed on an active surface of a semiconductor device when the device has a size restriction, though. Also, there is a minimum interval required for the pitch between neighboring pads because electrostatic malfunctions can occur between pads that are disposed in close proximity with an excessively small pitch. There is therefore a limit to the degree by which a semiconductor device can be miniaturized.

When considering these limitations, the size of a semiconductor device must naturally be increased to accommodate an increase in the number of its pads. From a manufacturing standpoint, this leads to a yield reduction in the number of semiconductor devices per wafer.

Also, an increase in the number of pads for a semiconductor device translates to an enlargement of the semiconductor device, which correlates to a finer pitch between wire patterns of a wiring substrate and an increase in size of the wiring substrate, thus increasing manufacturing costs of a semiconductor product.

Because making the pitch between wire patterns finer requires higher precision during manufacturing of a semiconductor device package, the assembly yield of the semiconductor device package decreases, and the manufacturing costs of the semiconductor device package increase.

One proposal for overcoming these problems and arranging a maximum number of pads at a minimum pitch is a staggered arrangement of the pads.

FIG. 1A is a plan view illustrating a bump arrangement of a typical semiconductor package, and FIG. 1B is an enlarged view of portion A of FIG. 1A.

Referring to FIGS. 1A and 1B, a semiconductor device package that has a semiconductor device 20 inner lead bonded (ILB) to a wiring substrate 10 may be a chip-on-board (COB) type package.

The semiconductor device 20 may have a bump arrangement in which first and second bump columns 22a and 22b are alternately arranged from the edge toward the center of an active surface of the semiconductor device 20. The first and second bump columns 22a and 22b may be arranged in a staggered formation.

Leads 12a and 12b of the wiring substrate 10 may correspond to the first and second bump columns 22a and 22b of the semiconductor device 20. The leads 12a and 12b may include first bump column leads 12a and second bump column leads 12b that respectively correspond to the first bump column 22a and the second bump column 22b.

To align the first and second bump columns 22a and 22b correspondingly with the first and second bump column leads 12a and 12b, the semiconductor device 20 is disposed in a mounting region of the wiring substrate 10, after which the semiconductor device 20 may be mounted on the wiring substrate 10 by applying heat and pressure. Thus, the first and second bump columns 22a and 22b may be electrically connected to the first and second bump column leads 12a and 12b.

When the pitch between leads is uniform in the above two-column staggered formation of bumps, there is a limit to the amount by which the size of the bumps can be increased. Thus, because there is little difference between the sizes of the bumps and leads, aligning errors can occur in which leads deviate from corresponding bumps during bonding between the bumps and leads in the manufacturing of semiconductor device packages.

As an alternative to the above described package, a bump arrangement in which many more bumps are provided in a second bump column than in a first bump column has been proposed. However, this arrangement has the limitation of reducing the flow of molding material during the process of mounting a semiconductor device on a wiring substrate. Therefore, this arrangement also does not provide a suitable solution.

The present invention addresses these and other disadvantages of the conventional art.

SUMMARY

The present invention provides a semiconductor device having a bump arrangement capable of minimizing misalignment of leads during the process of mounting the semiconductor device on a wiring substrate, and a semiconductor device package including the semiconductor device. The present invention also provides a semiconductor device having a bump arrangement capable of improving the flow of molding material injected during the process of manufacturing a semiconductor device package, and a semiconductor device package including the semiconductor device.

Some embodiments of the present invention provide semiconductor devices including: a first bump column on an active surface of the semiconductor device, the first bump column including a plurality of first bumps spaced a first distance from an edge of the semiconductor device; a second bump column on the active surface, the second bump column including a plurality of second bumps spaced a second distance from the edge of the semiconductor device, wherein the second distance is greater than the first distance; and a third bump column on the active surface, the third bump column including a plurality of third bumps spaced a third distance from the edge of the semiconductor device, wherein the third distance is greater than the second distance. The second bumps and the third bumps are sequentially alternated at least twice between the first bumps.

BRIEF DESCRIPTION OF THE FIGURES

The accompanying figures are included to provide a further understanding of the present invention, and are incorporated in and constitute a part of this specification. The drawings illustrate exemplary embodiments of the present invention and, together with the description, serve to explain principles of the present invention. In the figures:

FIG. 2B is an enlarged view of portion B of FIG. 2A;

FIG. 3B is an enlarged view of portion C of FIG. 3A.

DETAILED DESCRIPTION

Figure 1A:
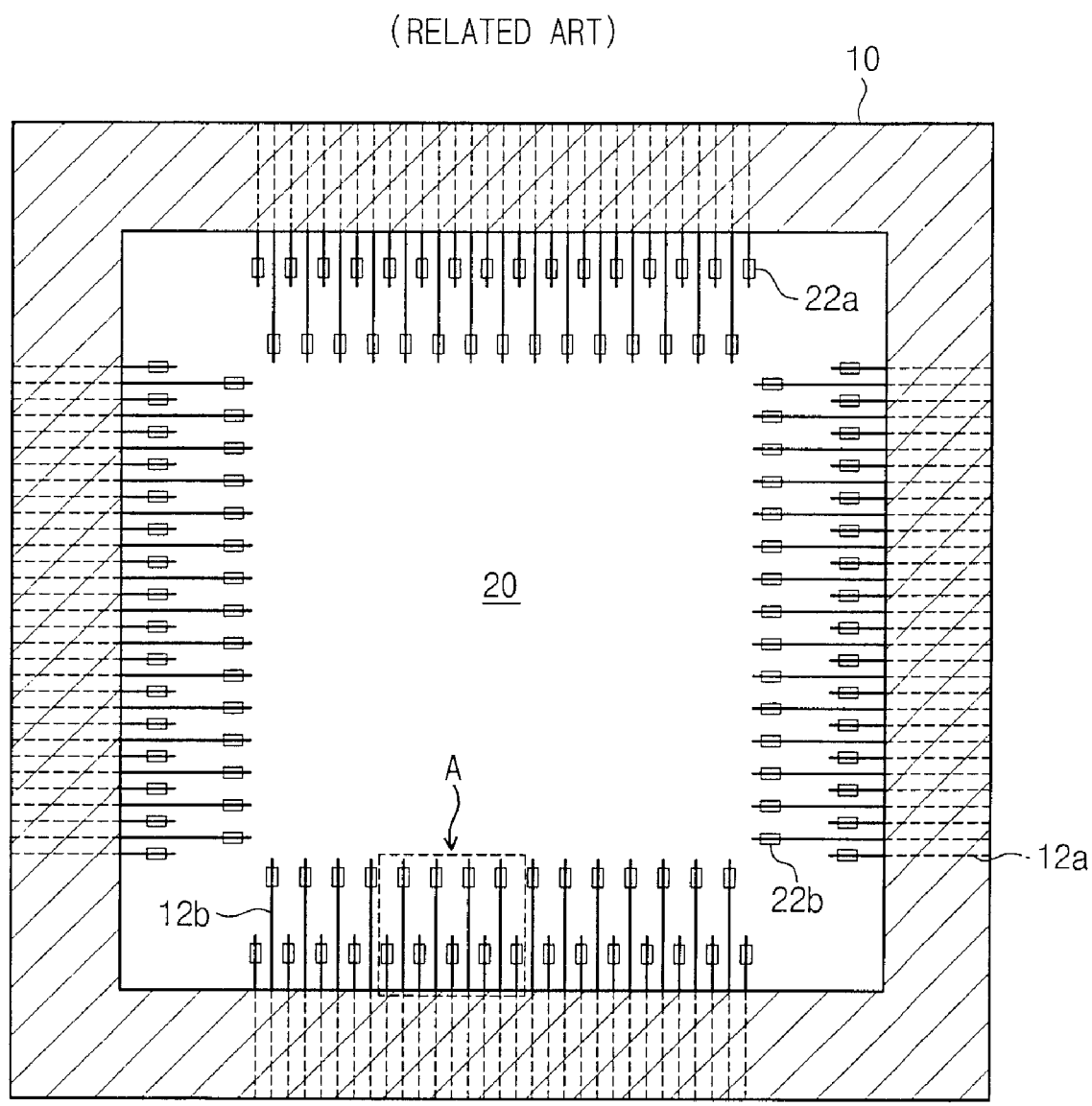
FIG. 1A is a plan view illustrating a bump arrangement of a typical semiconductor package.
Figure 1B:
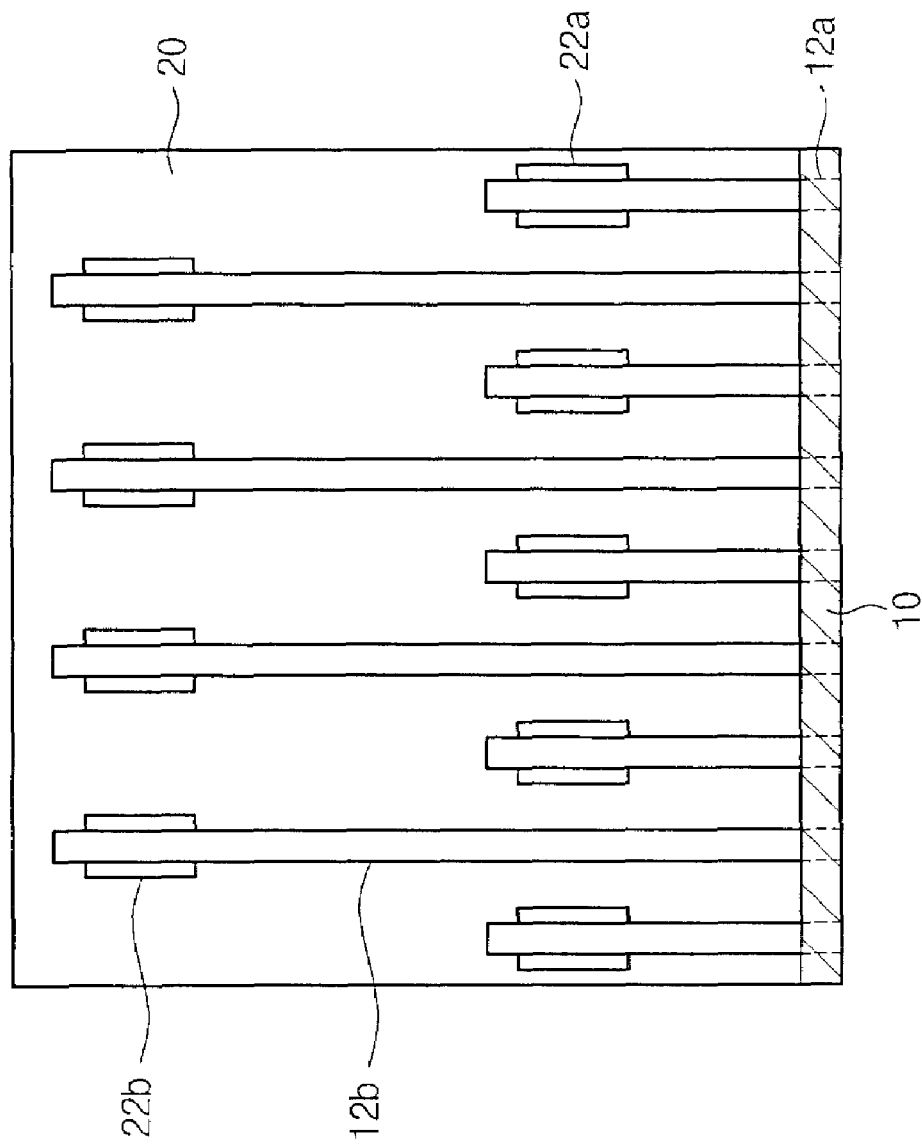
FIG. 1B is an enlarged view of portion A of FIG. 1A.

Preferred embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Since preferred embodiments are provided below, the order of the reference numerals given in the description is not limited thereto. In the figures, the dimensions of layers and regions are exaggerated for clarity of illustration. It will also be understood that when a layer (or film) is referred to as being 'on' another layer or substrate, it can be directly on the other layer or substrate, or intervening layers may also be present. Further, it will be understood that when a layer is referred to as being 'under' another layer, it can be directly under, and one or more intervening layers may also be present. In addition, it will also be understood that when a layer is referred to as being 'between' two layers, it can be the only layer between the two layers, or one or more intervening layers may also be present.

Hereinafter, exemplary embodiments of the present invention will be described with reference to the accompanying drawings.

Figure 2A:
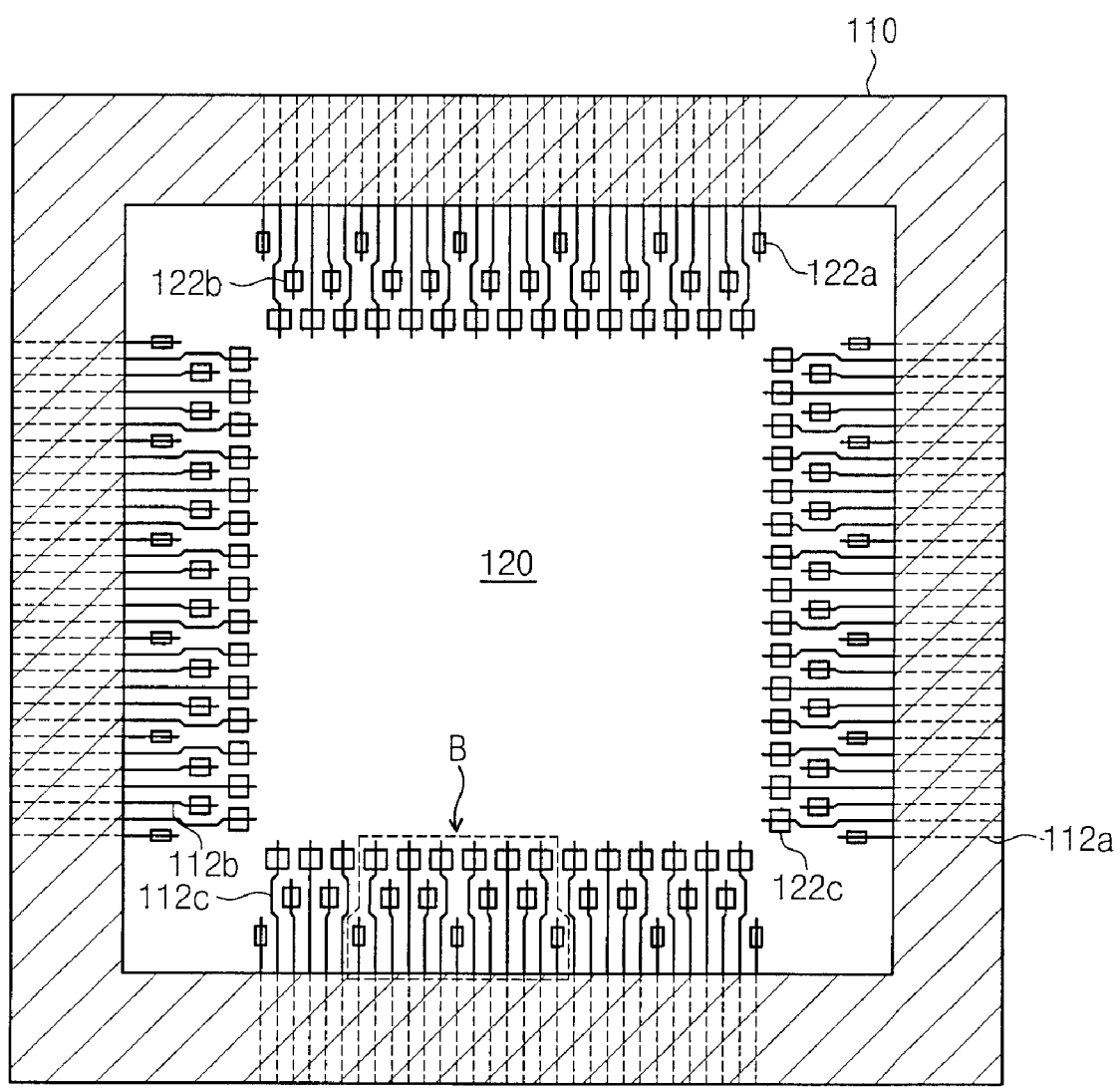
FIG. 2A is a plan view illustrating a bump arrangement of a semiconductor package according to an embodiment of the present invention.

FIG. 2A is a plan view illustrating a bump arrangement of a semiconductor package according to an embodiment of the present invention, and FIG. 2B is an enlarged view of portion B of FIG. 2A.

Referring to FIGS. 2A and 2B, a semiconductor device package is configured with a semiconductor device 120 inner lead bonded (ILB) to a wiring substrate 110, and is in the form of a chip-on-board (COB) package. The semiconductor device package of the present invention may be a flip chip (F/C) type package.

The wiring substrate 110 may be a system board including a printed circuit board (PCB). The wiring substrate 110 may be a flexible wiring substrate. The flexible wiring substrate may be a tape wiring substrate.

When the wiring substrate 110 is a tape wiring substrate, the wiring substrate 110 may be formed of a base film and a plurality of leads 112a, 112b, and 112c. The base film may be a polyimide or similar material having insulating and flexible properties. A window may be formed in a region on the wiring substrate 110 where the semiconductor device 120 is mounted. A package employing a wiring substrate 110 having the window formed therein is called a tape carrier package (TCP). Unlike the above, a window may not be formed in the region of the wiring substrate 110 where the semiconductor device 120 is mounted. A package employing a wiring substrate 110 not having such a window therein is called a chip on film (COF) package. The leads 112a, 112b, and 112c may be formed on the base film. The leads 112a, 112b, and 112c may include copper (Cu). The leads 112a, 112b, and 112c may be formed by photo etching a copper thin film laminated on the base film. Tin (Sn), gold (Au), nickel (Ni), and/or solder may be further plated on the surface of the leads 112a, 112b, and 112c. A TCP wiring substrate 110 may include a protective layer that at least partially covers the leads 112a, 112b, and 112c. The protective layer may be a solder resist.

The semiconductor device 120 may have a bump arrangement configuration that includes first, second, and third bump columns 122a, 122b, and 122c arranged in sequence from the edge toward the center of an active surface on which bonding pads (not shown) are formed. The first, second, and third bump columns 122a, 122b, and 122c may be separated by a first, second, and third distance from the edge of the semiconductor device 120, respectively. The first distance may be the shortest distance to the edge of the semiconductor device 120, the second distance may be greater than the first distance, and the third distance may be greater than the second distance. The semiconductor device package may include a plurality of first, second, and third bump columns 122a, 122b, and 122c, respectively. The bumps may be formed of metals such as gold, tin, copper, nickel, and/or combinations or alloys thereof. The bumps may be formed by plating, etc. The semiconductor device 120 may be a semiconductor chip or a semiconductor chip package. The first, second, and third bump columns 122a, 122b, and 122c may correspond to the bonding pads of the semiconductor device 120. The bonding pads may have the same arrangement as the first, second, and third bump columns 122a, 122b, and 122c, or a different arrangement. If the bonding pads have a different arrangement, the first, second, and third bump columns 122a, 122b, and 122c may be electrically connected to the bonding pads through redistribution (or rerouting).

The leads 112a, 112b, and 112c of the wiring substrate 110 may correspond to the first, second, and third bump columns 122a, 122b, and 122c of the semiconductor device 120. The leads 112a, 112b, and 112c may include first bump column leads 112a, second bump column leads 112b, and third bump column leads 112c that respectively correspond to the first, second, and third bump columns 122a, 122b, and 122c. After the semiconductor device 120 is disposed on the mounting region of the wiring substrate 110 so that the first, second, and third bump columns 122a, 122b, and 122c and the corresponding leads 112a, 112b, and 112c align, heat and pressure may be applied to mount the semiconductor device 120 on the wiring substrate 110. Thus, the first, second, and third bump columns 122a, 122b, and 122c and the corresponding leads 112a, 112b, and 112c can be electrically connected.

The bump arrangement of the semiconductor device 120 may be a configuration in which the second and third bump columns 122b and 122c are alternated at least two or more times between the first bump column 122a. The width between patterned leads 112a, 112b, and 112c may be reduced by as much as the number of second and third bump columns leads 112b and 112c passing between neighboring bumps of the first bump column 122a. The size of the bumps may be increased on the basis of the reduced width between the leads 112a, 112b, and 112c.

A bump arrangement according to some embodiments of the present invention may be a configuration in which bumps are arranged in the order of first, third, second, third, second, and third bumps. Five bumps may be disposed between neighboring bumps of the first bump column 122a, so that the second and third bump columns 122b and 122c are alternately arranged. Because the second and third bump columns 122b and 122c are alternately arranged, the bumps are not concentrated around one particular bump column.

Accordingly, the bump arrangement may have the bump sizes gradually increase from the first bump column 122a to the third bump column 122c. Also, the flow of injected molding material may be improved in order to increase electrical and physical reliability between the semiconductor device 120 and the wiring substrate 110.

Figure 3A:
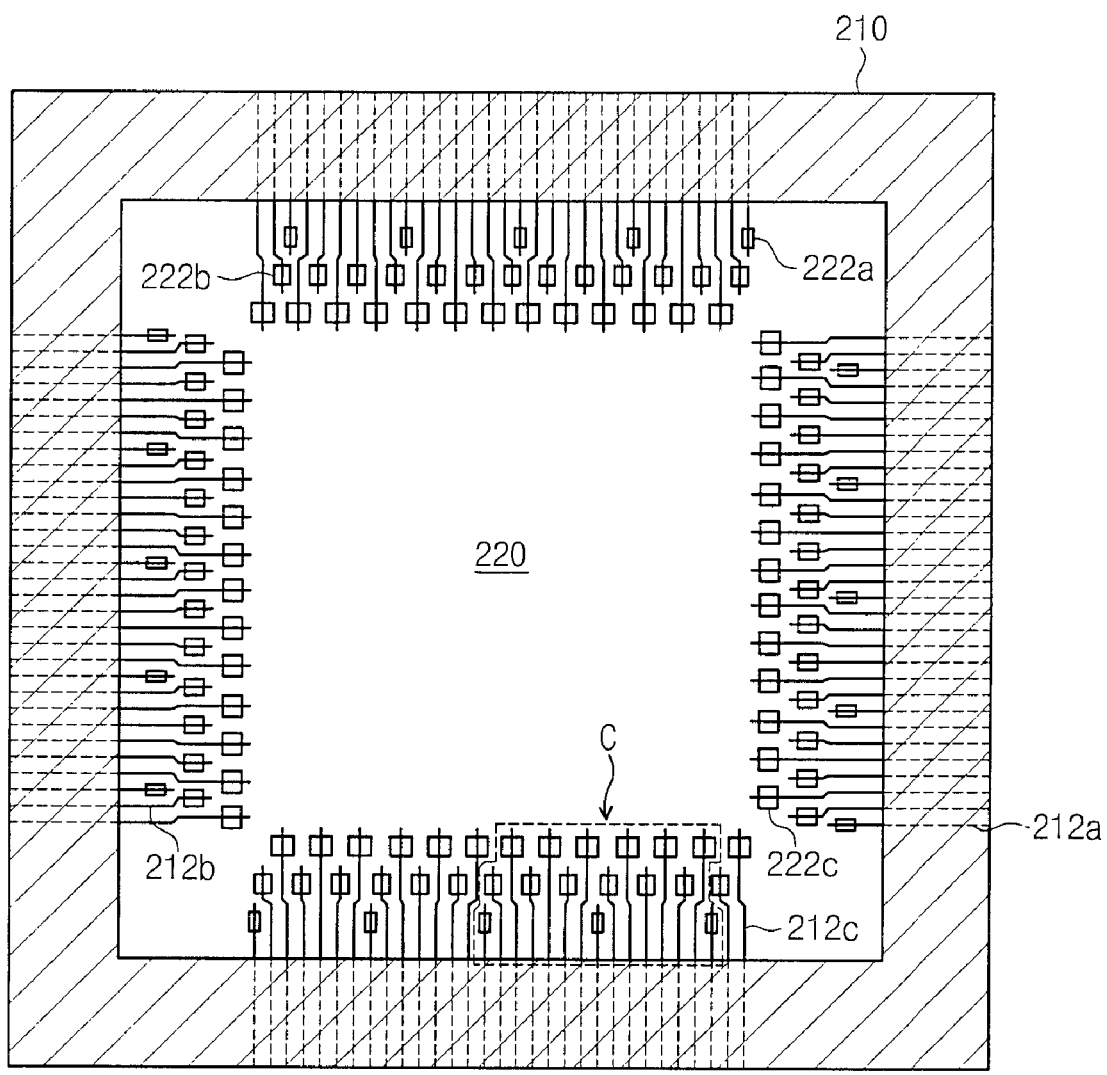
FIG. 3A is a plan view illustrating a bump arrangement of a semiconductor package according to another embodiment of the present invention.

FIG. 3A is a plan view illustrating a bump arrangement of a semiconductor package according to another embodiment of the present invention, and FIG. 3B is an enlarged view of portion C of FIG. 3A.

Referring to FIGS. 3A and 3B, a semiconductor device package may be a type of chip-on-board (COB) package in which a semiconductor device 220 is inner lead bonded (ILB) to a wiring substrate 210. The semiconductor device package of the present invention may be a flip chip (F/C) type package.

The wiring substrate 210 may be a system substrate including a printed circuit board (PCB). The wiring substrate 210 may be a flexible wiring substrate. The flexible wiring substrate may be a tape wiring substrate.

When the wiring substrate 210 is a tape wiring substrate, the wiring substrate 210 may be configured with a base film and a plurality of leads 212a, 212b, and 212c. The base film may be an insulating and flexible material such as a polyimide. The wiring substrate 210 may have a window formed in a region where the semiconductor device 220 is mounted. A package employing a wiring substrate 210 in which this window is formed is called a tape carrier package (TCP). Unlike the above, a window may not be formed in the region of the wiring substrate 210 on which the semiconductor device 220 is mounted. A package employing a wiring substrate 210 not having such a window is called a chip-on-film (COF) package. The leads 212a, 212b, and 212c may be formed on the base film. The leads 212a, 212b, and 212c may include copper. The leads 212a, 212b, and 212c may be formed by photo etching a copper thin film laminated on the base film. Tin, gold, nickel and/or solder may be further plated on the surface of the leads 212a, 212b, and 212c. The wiring substrate 210, called a TCP, may include a protective layer at least partially covering the leads 212a, 212b, and 212c. The protective layer may be a solder resist.

The semiconductor device 220 may have a bump arrangement with first, second, and third bump columns 222a, 222b, and 222c sequentially arranged from the edge toward the center of an active surface. The first, second, and third bump columns 222a, 222b, and 222c may be separated from the edge of the semiconductor device 220 by first, second, and third distances, respectively. The first distance may be the shortest from the edge of the semiconductor device 220, the second distance may be greater than the first distance, and the third distance may be greater than the second distance. The first, second, and third bump columns 222a, 222b, and 222c may respectively include a plurality of first, second, and third bumps. The bumps may be formed of a metal material such as gold, tin, copper, nickel, and/or a combination or alloy thereof. The semiconductor device 220 may be a semiconductor chip or a semiconductor chip package. The first, second, and third bump columns 222a, 222b, and 222c may correspond to bonding pads (not shown) of the semiconductor device 220. The bonding pads may have the same or different arrangements as the first, second, and third bump columns 222a, 222b, and 222c. In the case of bonding pads having a different arrangement, the first, second, and third bump columns 222a, 222b, and 222c may be electrically connected to the bonding pads through redistribution (or rerouting).

The leads 212a, 212b, and 212c of the wiring substrate 210 may correspond to the first, second, and third bump columns 222a, 222b, and 222c. The leads 212a, 212b, and 212c may include first bump column leads 212a, second bump column leads 212b, and third bump column leads 212c that respectively correspond to the first, second, and third bump columns 222a, 222b, and 222c. After the semiconductor device 220 is disposed on the wiring substrate 210 so that the first, second, and third bump columns 222a, 222b, and 222c are aligned with the corresponding leads 212a, 212b, and 212c, heat and pressure may be applied to mount the semiconductor device 220 on the wiring substrate 210. Thus, the first, second, and third bump columns 222a, 222b, and 222c and the corresponding leads 212a, 212b, and 212c may be electrically connected.

The bump arrangement of the semiconductor device 220 may be one in which the second and third bump columns 222b and 222c are alternated at least twice or more between the first bump column 222a. The width between the patterned leads 212a, 212b, and 212c may be reduced by as much as the number of second and third bump column leads 212b and 212c passing between neighboring bumps of the first bump column 222a. The reduced width between the leads 212a, 212b, and 212c may be a basis for the size by which the bumps are enlarged.

A bump arrangement according to another embodiment of the present invention may have bumps arranged in the order of first, second, third, second, third, second, and third bumps. Six bumps may be disposed between neighboring bumps of the first bump column 222a, so that the second and third bump columns 222b and 222c are alternately arranged. Because the second and third bump columns 222b and 222c are alternately arranged, the bumps are not concentrated around one particular bump column.

Accordingly, the bump arrangement may have the bump sizes gradually increase from the first bump column 222a to the third bump column 222c. Also, the flow of injected molding material may be improved in order to increase electrical and physical reliability between the semiconductor device 220 and the wiring substrate 210.

Unlike in typical bump arrangements, because the above-described semiconductor devices and semiconductor device packages including the semiconductor devices according to embodiments of the present invention have bump arrangements enabling enlargement of bumps, misalignment with leads during mounting of the semiconductor device on the wiring substrate can be minimized. Accordingly, an improvement in manufacturing yield of the semiconductor device package can be realized.

Also, unlike in typical bump arrangements, because the above-described semiconductor devices and semiconductor device packages including the semiconductor devices according to embodiments of the present invention have bump arrangements in which bumps are not concentrated around one particular bump column, the flow of molding material injected during manufacturing of the semiconductor device package can be improved. Therefore, a semiconductor device package with improved electrical and physical reliability can be provided.

As described above, a semiconductor device and a semiconductor device package including the semiconductor device according to the present invention have a bump arrangement that can minimize misalignment with leads during the mounting of the semiconductor device on a wiring substrate. Thus, an improvement in manufacturing yield of the semiconductor device package can be realized.

Also, the semiconductor device and the semiconductor device package including the semiconductor device according to the present invention have a bump arrangement that can improve the flow of molding material injected during manufacturing of the semiconductor device package. Therefore, a semiconductor device package with improved electrical and physical reliability can be provided.

Embodiments of the present invention provide semiconductor devices including: a first bump column on an active surface of the semiconductor device, and including a plurality of first bumps spaced a first distance from an edge of the semiconductor device; a second bump column on the active surface, and including a plurality of second bumps spaced a second distance that is greater than the first distance from the edge of the semiconductor device; and a third bump column on the active surface, and including a plurality of third bumps spaced a third distance that is greater than the second distance from the edge of the semiconductor device. The second bumps and the third bumps may be sequentially alternated at least twice between the first bumps.

In some embodiments, the semiconductor device may be a semiconductor chip or a semiconductor chip package.

In other embodiments, the first, second, and third bumps may be arranged in a sequence comprising one of the first bumps, one of the third bumps, one of the second bumps, one of the third bumps, one of the second bumps, and one of the third bumps.

In still other embodiments, the first, second, and third bumps may be arranged in a sequence comprising one of the first bumps, one of the second bumps, one of the third bumps, one of the second bumps, one of the third bumps, one of the second bumps, and one of the third bumps.

In even other embodiments, the second bumps may be larger than the first bumps, and/or the third bumps may be larger than the second bumps.

In other embodiments of the present invention, semiconductor device packages include: a semiconductor device; a first bump column on an active surface of the semiconductor device and including a plurality of first bumps spaced a first distance from an edge of the semiconductor device, a second bump column on the active surface and including a plurality of second bumps spaced a second distance that is greater than the first distance from the edge of the semiconductor device, and a third bump column on the active surface and including a plurality of third bumps spaced a third distance that is greater than the second distance from the edge of the semiconductor device; and a wiring substrate on which the semiconductor device is mounted, the wiring substrate including a plurality of leads corresponding to the bumps. The second bumps and the third bumps may be sequentially alternated at least twice between the first bumps.

In some embodiments, the semiconductor device may be a semiconductor chip or a semiconductor chip package.

In other embodiments, the first, second, and third bumps may be arranged in a sequence comprising one of the first bumps, one of the third bumps, one of the second bumps, one of the third bumps, one of the second bumps, and one of the third bumps.

In still other embodiments, the first, second, and third bumps may be arranged in a sequence comprising one of the first bumps, one of the second bumps, one of the third bumps, one of the second bumps, one of the third bumps, one of the second bumps, and one of the third bumps.

In even other embodiments, the second bumps may be larger than the first bumps, and/or the third bumps may be larger than the second bumps.

In yet other embodiments, the wiring substrate may be a flexible wiring substrate, and the flexible wiring substrate may be a tape wiring substrate.

According to some embodiments, the wiring substrate may comprise a base film and the leads may be disposed on the base film. The wiring substrate may also comprise a protective layer covering at least a portion of the leads.

According to some embodiments, the leads may comprise copper. The leads may also comprise a plating material including one or more of tin, gold, nickel, and solder.

The above-disclosed subject matter is to be considered illustrative, and not restrictive, and the appended claims are intended to cover all such modifications, enhancements, and other embodiments, which fall within the true spirit and scope of the present invention. Thus, to the maximum extent allowed by law, the scope of the present invention is to be determined by the broadest permissible interpretation of the following claims and their equivalents, and shall not be restricted or limited by the foregoing detailed description.

What is claimed is:

1. A semiconductor device, comprising:
   a first bump column on an active surface of the semiconductor device, the first bump column including a plurality of first bumps spaced a first distance from an edge of the semiconductor device;
   a second bump column on the active surface, the second bump column including a plurality of second bumps spaced a second distance from the edge of the semiconductor device, wherein the second distance is greater than the first distance; and
   a third bump column on the active surface, the third bump column including a plurality of third bumps spaced a third distance from the edge of the semiconductor device, wherein the third distance is greater than the second distance,
   wherein the second bumps and the third bumps are sequentially alternated one by one at least twice between the first bumps, and
   wherein bumps directly adjacent to each other in a parallel direction with the edge of the semiconductor device are on different ones of the first bump column, the second bump column, and the third bump column.

2. The semiconductor device of claim 1, wherein the semiconductor device is a semiconductor chip or a semiconductor chip package.

3. The semiconductor device of claim 1, wherein the first, second, and third bumps are arranged sequentially as one of the first bumps, one of the third bumps, one of the second bumps, one of the third bumps, one of the second bumps, and one of the third bumps.

4. The semiconductor device of claim 1, wherein the first, second, and third bumps are arranged sequentially as one of the first bumps, one of the second bumps, one of the third bumps, one of the second bumps, one of the third bumps, one of the second bumps, and one of the third bumps.

5. The semiconductor device of claim 1, wherein the second bumps are larger than the first bumps.

6. The semiconductor device of claim 1, wherein the third bumps are larger than the second bumps.

7. A semiconductor device package, comprising:
   a semiconductor device;
   a first bump column on an active surface of the semiconductor device and including a plurality of first bumps spaced a first distance from an edge of the semiconductor device, a second bump column on the active surface and including a plurality of second bumps spaced a second distance that is greater than the first distance from the edge of the semiconductor device, and a third bump column on the active surface and including a plurality of third bumps spaced a third distance that is greater than the second distance from the edge of the semiconductor device; and a wiring substrate on which the semiconductor device is mounted, the wiring substrate including a plurality of leads corresponding to the first, second, and third bumps, wherein the second bumps and the third bumps are sequentially alternated one by one at least twice between the first bumps, wherein bumps directly adjacent to each other in a parallel direction with the edge of the semiconductor device are on different ones of the first bump column, the second bump column, and the third bump column, and wherein only one lead is disposed between leads corresponding to adjacent bumps of the second bump column and only one lead is disposed between leads corresponding to adjacent bumps of the third bump column.

8. The semiconductor device package of claim 7, wherein the semiconductor device is a semiconductor chip or a semiconductor chip package.

9. The semiconductor device package of claim 7, wherein the first, second, and third bumps are arranged sequentially as one of the first bumps, one of the third bumps, one of the second bumps, one of the third bumps, one of the second bumps, and one of the third bumps.

10. The semiconductor device package of claim 7, wherein the first, second, and third bumps are arranged sequentially as one of the first bumps, one of the second bumps, one of the third bumps, one of the second bumps, one of the third bumps, one of the second bumps, and one of the third bumps.

11. The semiconductor device package of claim 7, wherein the second bumps are larger than the first bumps.

12. The semiconductor device package of claim 7, wherein the third bumps are larger than the second bumps.

13. The semiconductor device package of claim 7, wherein the wiring substrate is a flexible wiring substrate.

14. The semiconductor device package of claim 13, wherein the flexible wiring substrate is a tape wiring substrate.

15. The semiconductor device package of claim 7, wherein the wiring substrate comprises a base film and wherein the leads are disposed on the base film.

16. The semiconductor device package of claim 15, wherein the wiring substrate comprises a protective layer covering at least a portion of the leads.

17. The semiconductor device package of claim 7, wherein the plurality of leads has a uniform pitch therebetween at the edge of the semiconductor device.

* * * * *